June 2, 1970 R. E. BOONE 3,516,003
HIGH-GAIN SINGLE-STAGE A.C. CASCODE AMPLIFIER CIRCUIT
Filed July 30, 1968
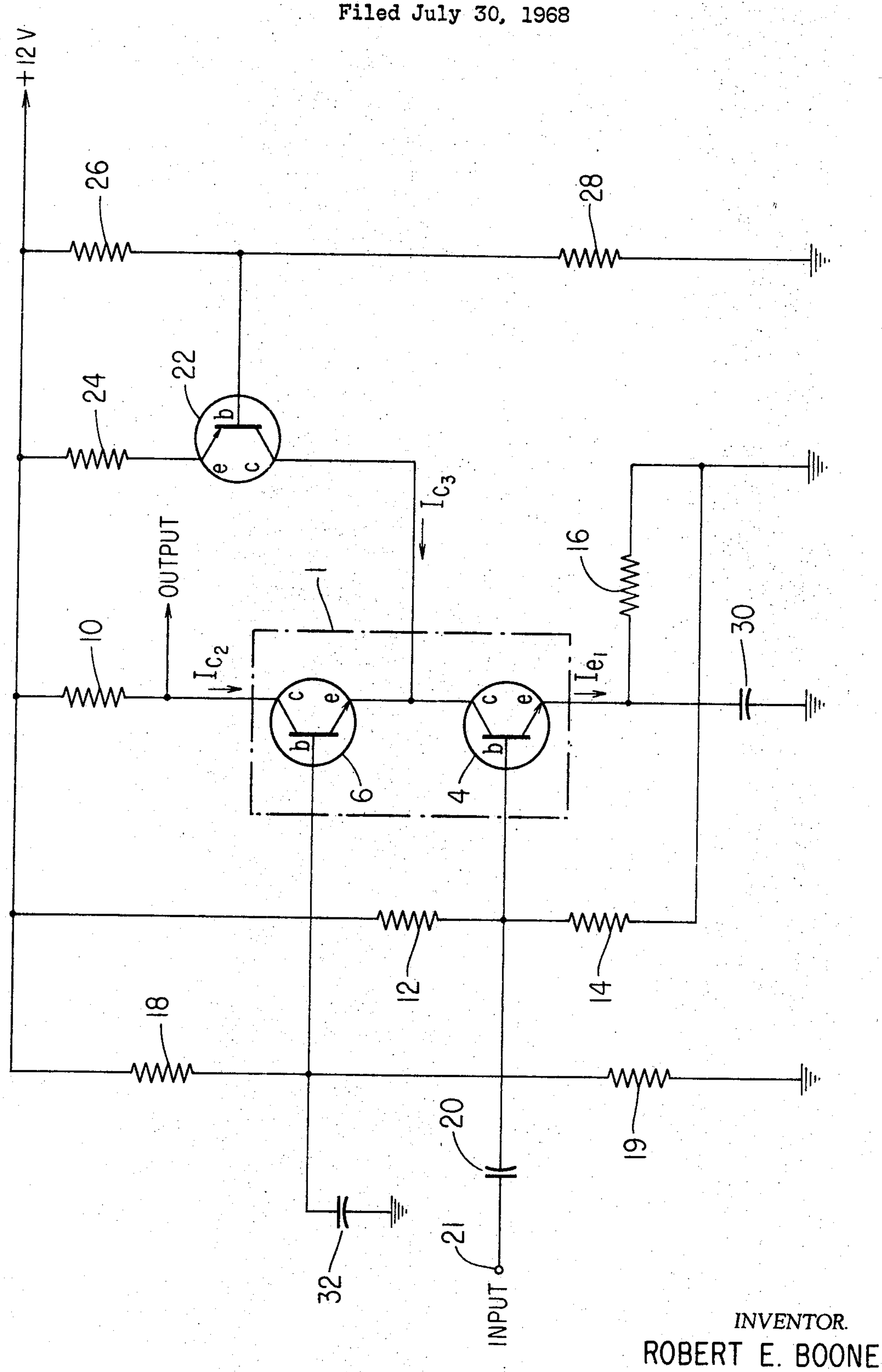
INVENTOR.
ROBERT E. BOONE
BY John F. Lubra
ATTORNEY United States Patent Office 3,516,003

Patented June 2, 1970

3,516,003

HIGH-GAIN SINGLE-STAGE A.C. CASCODE AMPLIFIER CIRCUIT

Robert E. Boone, Euclid, Ohio, assignor to Bailey Meter Company, a corporation of Delaware Filed July 30, 1968, Ser. No. 748,738
Int. Cl. H03f 3/16, 3/18
U.S. Cl. 330—17 6 Claims

ABSTRACT OF THE DISCLOSURE

A circuit for providing high voltage gain in a solid-state, cascode amplifier wherein the gain is a direct function of the transconductance of an input transistor and the resistance of a load circuit connected to an output transistor. A circuit including a current source which supplies current to the input transistor to produce high transconductance while permitting a high-value load resistor to be inserted in the output circuit.

BACKGROUND OF THE INVENTION

Field of the invention

This invention relates generally to an amplifier gain control circuit and more particularly to a circuit means for providing high voltage gain from a solid-state, cascode amplifier circuit.

Description of the prior art

In order to achieve high voltage gain in a cascode amplifier, it is necessary to have a high transconductance in the input transistor and a high load impedance on the output transistor. Since the current of the load impedance is nearly equal to the current through the input transistor, and since the input transistor requires a relatively high value of D.C. current flow to achieve high transconductance, the load must have a relatively low static impedance and a high dynamic impedance to achieve a high A.C. voltage gain without using large power supply voltages. This can be accomplished with a tuned LC circuit for a load impedance; however, the use of reactive components limits the amplifier bandwidth. The use of a current source to supply most of the D.C. current to the input transistor allows the use of a relatively high-value resistor for a load impedance and also maintains high transconductance in the input transistor. This high A.C. gain is achieved without the bandwidth limitations inherent in the use of reactive components for the load impedance.

SUMMARY OF THE INVENTION

In a solid-state A.C. cascode amplifier circuit, the voltage gain is equal to the product of the transconductance ($g_m$) of an input transistor and the resistance value of an output load resistor $R_L$. The transconductance of the input transistor is a direct function of emitter current flow and, therefore, high current flow is desirable. This same bias current passes through a load resistor $R_L$ and, therefore, limits the value of $R_L$ so as not to exceed the voltage rating of the transistors. The invention provides a current source which drives only the input transistor to achieve high transconductance while permitting low current flow in the output circuit and consequently, the use of a high-value load resistor. This combination of high transconductance and high load resistance provides optimum voltage gain.

BRIEF DESCRIPTION OF THE DRAWING

The drawing is a schematic illustration of the preferred embodiment.

DESCRIPTION OF THE PREFERRED EMBODIMENT

The drawing illustrates schematically an A.C. amplifier stage including a conventional cascode circuit 1 which is comprised of input transistor 4 and output transistor 6. Conventional cascode amplifier circuit 1 is modified by the addition of transistor 22 such that transistor 4 functions as an input transistor, transistor 6 functions as an output transistor and transistor 22, with collector electrode **22*c* connected to collector electrode 4*c* of input transistor 4, functions as a current source to input transistor 4**. It will be apparent to one skilled in the art that uni-polar, or field effect, transistors can be substituted for the bi-polar transistors illustrated and described. The drain, source and gate electrodes of the uni-polar transistor correspond to the collector, emitter and base electrodes respectively of the bi-polar transistor.

The voltage gain of the cascode amplifier circuit is approximately equal to the product of the transconductance ($g_m$) of input transistor 4 and the output load resistor 10. In circuit 1, the transconductance of input transistor 4 varies as a direct function of the D.C. emitter current $I_{e1}$. Therefore, in order to maintain transconductance ($g_m$) of transistor 4 at a relatively high value to achieve the desired voltage gain, the value of emitter current $I_{e1}$ must be significantly high. Furthermore, it is apparent that in order to achieve desired voltage gain, the value of load resistor 10 must be high. By the nature of the arrangement of the conventional cascode amplifier consisting basically of transistor 4 and transistor 6 and output load resistor 10, the optimum circuit voltage gain is not achievable. The maximum voltage gain of an input signal applied to base electrode **4*b* of input transistor and measured across output load resistor 10 in the conventional cascode circuit is limited by the supply voltage rating of circuit 1 and the approximate equality of the current flow in the emitter circuit of transistor 4 and the collector circuit of transistor 6. It is apparent that a supply voltage rating of 12 volts D.C. and a requirement for a high value of emitter current $I_{e1}$ would necessarily limit the value of output load resistor 10. As noted previously, the collector current $I_{c2}$ is approximately equal to emitter current $I_{e1}$, and any attempt to increase the value of resistor 10 would merely result in reduction of emitter current $I_{e1}$ and necessarily the reduction of transconductance ($g_m$) of transistor 4**.

The circuit which is illustrated in conjunction with amplifier circuit 1 permits realization of optimum circuit voltage gain by limiting the current $I_{c2}$ to a value which will accommodate a high value output load resistor 10, and, at the same time, establish the value of emitter current $I_{e1}$ required for high transconductance.

In the drawing, resistors 12 and 14 establish D.C. bias voltage at the base electrode **4*b* of input transistor 4. Resistor 16, in conjunction with bias resistors 12 and 14, establish the D.C. emitter $I_{e1}$ of input transistor 4. Output transistor 6 base bias voltage is provided by the voltage divider circuit comprised of resistors 18 and 19. Input coupling capacitor 20 isolates amplifier circuit 1 from external D.C. signals which could affect amplifier operating conditions while, at the same time, permitting the transmission of A.C. input voltage signals from input terminal 21 to the base electrode 4*b* of input transistor 4. Input transistor 4 amplifies the A.C. input signal and converts it to an A.C. current signal at collector electrode 4*c*. The current level established by transistor 4 at collector electrode 4*c*, which current value is a function of the transconductance of input transistor 4, is transmitted through emitter electrode 6*e* and collector electrode 6*c* of output transistor 6 to output load resistor 10. Allowing for a small A.C. current flow in base junction 6*b***, the remaining A.C. current signal flows in the collector electrode 6c of transistor 6 and develops an A.C. output voltage signal across load resistor 10.

As noted previously, maximum voltage gain can only be realized in the cascode amplifier circuit when transconductance ($g_m$) of transistor 4 is high and load resistor 10 is of a significantly high value. The desirable high values of transconductance and load resistance which heretofore were not mutually obtainable can be realized due to the operation of transistor 22. Transistor 22 functions as a current source. The D.C. collector current $I_{c3}$ output of transistor 22, which is established by transistor bias resistors 24, 26 and 28, is transmitted to the collector electrode 4c of input transistor 4. The increase in D.C. current flow through the collector and emitter junctions of transistor 4 produces the desired transconductance level of transistor 4. The high impedance path exhibited by transistor 6 assures the flow of collector current $I_{c3}$ through transistor 4. The operation of transistor 22, in supplying the majority of the D.C. emitter current $I_{e1}$ of transistor 4, permits the use of a high value load resistor 10 in the collector electrode circuit of output transistor 6 in which a relatively small current flows.

Capacitors 30 and 32, connected to emitter electrode 4e and base electrode 6b, function as A.C. bypass capacitors for transistors 4 and 6 respectively by providing an A.C. circuit common or ground reference for each of said transistors. In the absence of capacitors 30 and 32, the portion of the A.C. signal which is present in the emitter circuit of transistor 4 and the base circuit of transistor 6 would develop A.C. voltage signals across the bias resistors associated with these transistors. The voltages developed would represent feedback signals and would limit the over-all circuit gain. Capacitors 30 and 32, therefore, represent a low A.C. impedance and, as such, provide an A.C. shunt between emitter electrode 4e and circuit common and between base electrode 6b and circuit common.

The embodiment illustrated in the drawing represents a typical embodiment of the invention. It is apparent that changes can be made to the circuit and selection of components, such as substituting one or more uni-polar transistors, commonly referred to as field effect transistors, for the bi-polar transistors illustrated, without departing from the scope of the invention.

What I claim as new and desire to secure by Letters Patent of the United States is:

1. In a single-stage, solid-state, A.C., cascode amplifier circuit comprising an input transistor having a transconductance $g_m$ and an output transistor having a load resistor $R_L$ across which an output voltage signal is developed proportional to the product $g_mR_L$, the improvement comprising:

circuit means for providing a supplemental D.C. bias current to flow in the forward direction through said input transistor to maximize the effective transconductance $g_m$ of said input transistor thereby maximizing the output voltage signal developed across said load resistor $R_L$.

2. A single-stage, solid-state, A.C. cascode amplifier circuit as claimed in claim 1, wherein said current circuit means includes a current source transistor having an output current electrode connected to said input transistor to series aid the flow of D.C. current through said input transistor.

3. A single-stage, solid-state, A.C. cascode amplifier circuit as claimed in claim 1, wherein said input and output transistors are of the bi-polar type, each having a base, a collector and an emitter electrode, said input transistor connected in a common emitter configuration with the base electrode connected to the A.C. input signal and said output transistor connected in a common base configuration with the emitter electrode connected to the collector electrode of said input transistor and the collector electrode of said output transistor connected to said load resistor, said circuit means for providing a supplemental bias current including a current source transistor of the bi-polar type having a base, a collector and an emitter electrode, a D.C. bias voltage circuit for said current source transistor, said base and emitter electrodes being connected to said bias voltage circuit to establish current flow through the emitter-collector junction, said collector electrode being connected to the collector electrode of said input transistor to provide the supplemental D.C. bias current.

4. A single-stage, solid-state, A.C., cascode amplifier circuit as claimed in claim 1, wherein said input and output transistors are of the uni-polar type, each having a gate, source and drain electrode, said input transistor connected in a common source configuration with the gate electrode connected to the A.C. input signal and said output transistor connected in a common gate configuration with the source electrode connected to the drain electrode of said input transistor and the drain electrode of said output transistor connected to said load resistor, said current circuit means including a current source transistor of the uni-polar type having a gate, source and drain electrode, a D.C. bias voltage circuit for said current source transistor, said gate and source electrodes being connected to said bias voltage circuit to establish current flow through the source-drain junction, said drain electrode being connected to the drain electrode of said input transistor to provide the supplemental D.C. bias current.

5. A single-stage, solid-state, A.C., cascode amplifier circuit as claimed in claim 3 further including a first and second bypass capacitor, said first bypass capacitor between the emitter electrode of the input transistor and circuit common and the second bypass capacitor connected between the base electrode of the output transistor and circuit common;

whereby A.C. signals flowing in said electrodes, which otherwise might develop A.C. feedback voltages in said D.C. bias voltage circuit thereby reducing circuit gain, are, instead, shunted to circuit common.

6. A single-stage, solid-state, A.C., cascode amplifier circuit as claimed in claim 4 further including a first and second bypass capacitor, said first bypass capacitor connected between the source electrode of the input transistor and circuit common and the second bypass capacitor connected between the gate electrode of the output transistor and circuit common;

whereby A.C. signals flowing in said electrode, which otherwise might develop A.C. feedback voltages in said D.C. bias voltage circuit and thereby reduce current gain, are, instead, shunted to circuit common.

References Cited

UNITED STATES PATENTS

| | | | |
|---|---|---|---|
| 3,268,827 | 8/1966 | Carlson et al. | 330—18 |
| 3,351,865 | 11/1967 | Dow et al. | 330—18 X |
| 3,368,156 | 2/1968 | Kam | 330—18 |
| 3,443,238 | 5/1969 | Fynn et al. | 330—18 |

ROY LAKE, Primary Examiner

S. H. GRIMM, Assistant Examiner

U.S. Cl. X.R.

330—18, 20, 22, 35, 40